US005831991A

United States Patent [19]
Miller et al.

[11] Patent Number: 5,831,991
[45] Date of Patent: Nov. 3, 1998

[54] METHODS AND APPARATUS FOR ELECTRICALLY VERIFYING A FUNCTIONAL UNIT CONTAINED WITHIN AN INTEGRATED CIRUCUIT

[75] Inventors: Brian C. Miller; Alan S. Krech, Jr., both of Fort Collins, Colo.

[73] Assignee: Hewlett-Packard Co., Palo Alto, Calif.

[21] Appl. No.: 763,371

[22] Filed: Dec. 13, 1996

[51] Int. Cl.[6] .................................................... G01R 31/28

[52] U.S. Cl. ........................................................... 371/22.1

[58] Field of Search ................................ 371/22.1, 22.2, 371/22.5, 22.6; 365/201; 324/158.1

[56] References Cited

U.S. PATENT DOCUMENTS

| | | | |
|---|---|---|---|
| 4,038,648 | 7/1977 | Chesley | 340/173 R |
| 4,730,317 | 3/1988 | Desyllas et al. | 371/25.1 |
| 4,914,379 | 4/1990 | Maeno | 371/22.3 |
| 4,969,148 | 11/1990 | Nadeau-Dostie et al. | 371/21.1 |
| 5,130,645 | 7/1992 | Levy | 324/158 R |
| 5,668,817 | 9/1997 | Adham | 371/22.4 |

*Primary Examiner*—Hoa T. Nguyen

[57] ABSTRACT

Apparatus for electrically verifying a functional unit contained within an integrated circuit comprises a functional unit, a state machine, a number of integrated circuit input pins, and means for alternately providing the functional unit with control data derived from the state machine, and control data derived from the number of integrated circuit input pins. The means for providing control data from alternating sources comprises a multiplexor which receives a first set of inputs from the state machine, and a second set of inputs from a test control block. The test control block monitors various of the integrated circuit input pins for a designated instruction, receives control data via the input pins, and controls the operation of the multiplexor. The test control block comprises a number of test registers which can be configured to receive two or more states of control data. An additional multiplexor, internal to the test control block, may then be used to sequentially provide successive states of "test" control data to the functional unit.

20 Claims, 3 Drawing Sheets

METHODS AND APPARATUS FOR ELECTRICALLY VERIFYING A FUNCTIONAL UNIT CONTAINED WITHIN AN INTEGRATED CIRUCUIT

FIELD OF THE INVENTION

This invention pertains to the electrical verification of a functional unit contained within an integrated circuit. More specifically, this invention pertains to methods and apparatus which provide a means for electrically verifying a floating-point megacell which is deeply embedded within a silicon device.

BACKGROUND OF THE INVENTION

Electrical verification of a high performance, deeply embedded floating-point megacell requires that hundreds of millions of combinations of vectors be executed at speed on a silicon device. Electrical verification is required to find all of the timing and noise margin issues (e.g., coupling, wire glitches, etc.) that may exist in a very complex functional unit such as a floating-point or integer unit. These faults cannot be fully simulated pre-silicon due to the large number of vectors required, and the complex electrical interactions between the thousands of nodes and states involved. Electrical verification is made even more difficult when a functional unit is deeply embedded in a host machine (e.g., a graphics pipeline), since all of the inputs and outputs (I/Os) of the functional unit may not be easily accessible.

Conventional methods of electrically verifying an integrated circuit include scan tests, parallel pin tests, and dedicated pad tests.

Scan tests allow an engineer to control and observe all of the I/Os of all of the functional units contained within an integrated circuit. However, scan tests impose a high test time overhead, and do not provide for interstate electrical fault verification.

While parallel pin tests have much less overhead, they provide limited access to the I/Os of an embedded functional unit.

Dedicated pads connected to the I/Os of an embedded functional unit provide for externalizing its I/Os through test-enabled multiplexors. However, while providing test bandwidth, dedicated pad tests use costly chip area, and sacrifice timing margins.

It is therefore a primary object of this invention to provide methods and apparatus for electrically verifying a functional unit (such as a floating point megacell) which is deeply embedded in a silicon device.

Another object of this invention is to provide electrical verification methods and apparatus which give greater control over internal signals of a silicon device.

An additional object of this invention is to provide electrical verification methods and apparatus which require little hardware and/or test time overhead.

Yet another object of this invention is to provide electrical verification methods and apparatus which are simple to configure and use.

SUMMARY OF THE INVENTION

In the achievement of the foregoing objects, the inventors have devised methods 500 and apparatus 300 which enable the electrical verification of a deeply embedded functional unit 104 with the addition of only a multiplexor 304 and a test control block 310. Together, the multiplexor 304 and test control block 310 can be implemented in fewer than fifty gates, thereby minimizing hardware and chip area requirements.

When in test mode, control data 306 is provided to a functional unit 212 via the test control block 310 rather than a state machine 216. At the same time, operands and/or other data 210 may be provided to the functional unit 212 via a parallel pin test and the functional unit's usual I/O datapath (s) 202, 204, 206, 208, 210. The functional unit 212 is oblivious to the fact that it is receiving control data 306 via a test control block 310 rather than a state machine 216, and continues to operate at speed.

Test mode is enabled by a special instruction. The test control block 310 can be configured to "snoop" integrated circuit input pins 204 for the existence of the special instruction, or alternatively, a processing unit may supply the test control block 310 with a control signal 316 when the special instruction is received. After acknowledging the special instruction, the test control block 310 takes control of the bus 308 carrying control data and loads one or more of its registers 402, 404, 406, 408 with one or more states of control data.

Just as operand and/or other data may be provided to a functional unit 212 via a parallel pin test, the output(s) 220 of a functional unit 212 may be read from an integrated circuit 100 via a parallel pin test and the functional unit's usual I/O datapath(s) 220, 222, 224, 226, 228. In this manner, a functional unit 212 may be electrically verified by controlling and observing all of its I/Os 210, 220, 306.

The methods 500 and apparatus 300 allow electrical verification of a functional unit 212 to be performed at speed, yet with greatly increased observability, controllability, and access to a chip's internal state.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 1:
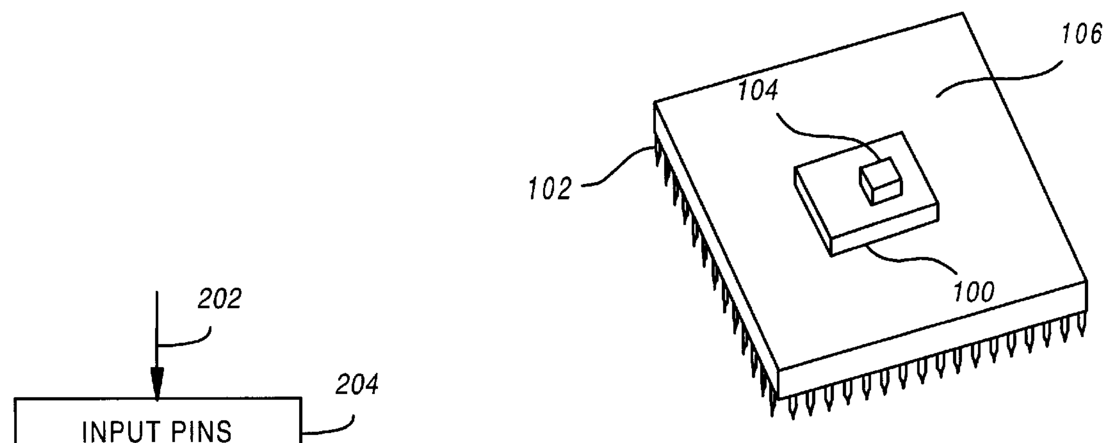
FIG. 1 illustrates a functional unit contained within an integrated circuit.

Methods and apparatus 300 for electrically verifying a functional unit 212 contained within an integrated circuit 100 are pictured in FIGS. 1–5. In conformance with these figures, and the following description, a method 500 (FIG. 5) of electrically verifying a functional unit 212 contained within an integrated circuit 100 may generally comprise the steps of programming 502 a test control block 310 with control data 308, and alternately providing 504 a functional unit 212 contained within an integrated circuit 100 with control data 302 derived from a state machine 216, and control data 312 derived from the programmed test control block 310.

Also in conformance with FIGS. 1–5 and the following description, a first embodiment of apparatus 300 (FIG. 3) for electrically verifying a functional unit 212 contained within an integrated circuit 100 may generally comprise a functional unit 212, a state machine 216, and a number of circuit points 204 coupled so as to alternately provide the functional unit 212 with control data 302 derived from the state machine 216, and control data 312 derived from the number of circuit points 204.

Alternatively, apparatus 300 for electrically verifying a functional unit 212 contained within an integrated circuit 100 may comprise a functional unit 212, a state machine 216, a number of integrated circuit input pins 204, and means 304, 310 for alternately providing the functional unit 212 with control data 302 derived from the state machine 216, and control data 312 derived from the number of integrated circuit input pins 204. The functional unit 212 is embedded within the integrated circuit 100; and the integrated circuit input pins 204, 102 are interconnected with the integrated circuit 100, and mounted on an integrated circuit package 106 so as to be externally accessible on the integrated circuit package 106.

Having generally described methods 500 and apparatus 300 for electrically verifying a functional unit 212 contained within an integrated circuit 100, the methods 500 and apparatus 300 will now be described in further detail.

An exemplary host integrated circuit (IC) package 106 in which the methods and apparatus disclosed herein might be implemented is illustrated in FIG. 1. The IC package 106 comprises integrated circuit I/O pins 102 through which signals are sent and/or received to/from other devices. As used in this description, the term "integrated circuit I/O pins" 102 is defined to include any means by which an IC 100 communicates with other devices, including, but not limited to: package pins, contact pads, and terminals. The FIG. 1 IC 100 also comprises a functional unit 104 embedded therein. The embedded functional unit 104 may comprise 1) I/Os that are not accessible via the integrated circuit I/O pins 102, and/or 2) I/Os that are only accessible via the integrated circuit I/O pins 102 through sacrifices in timing margins, test time, and/or chip area.

Figure 2:
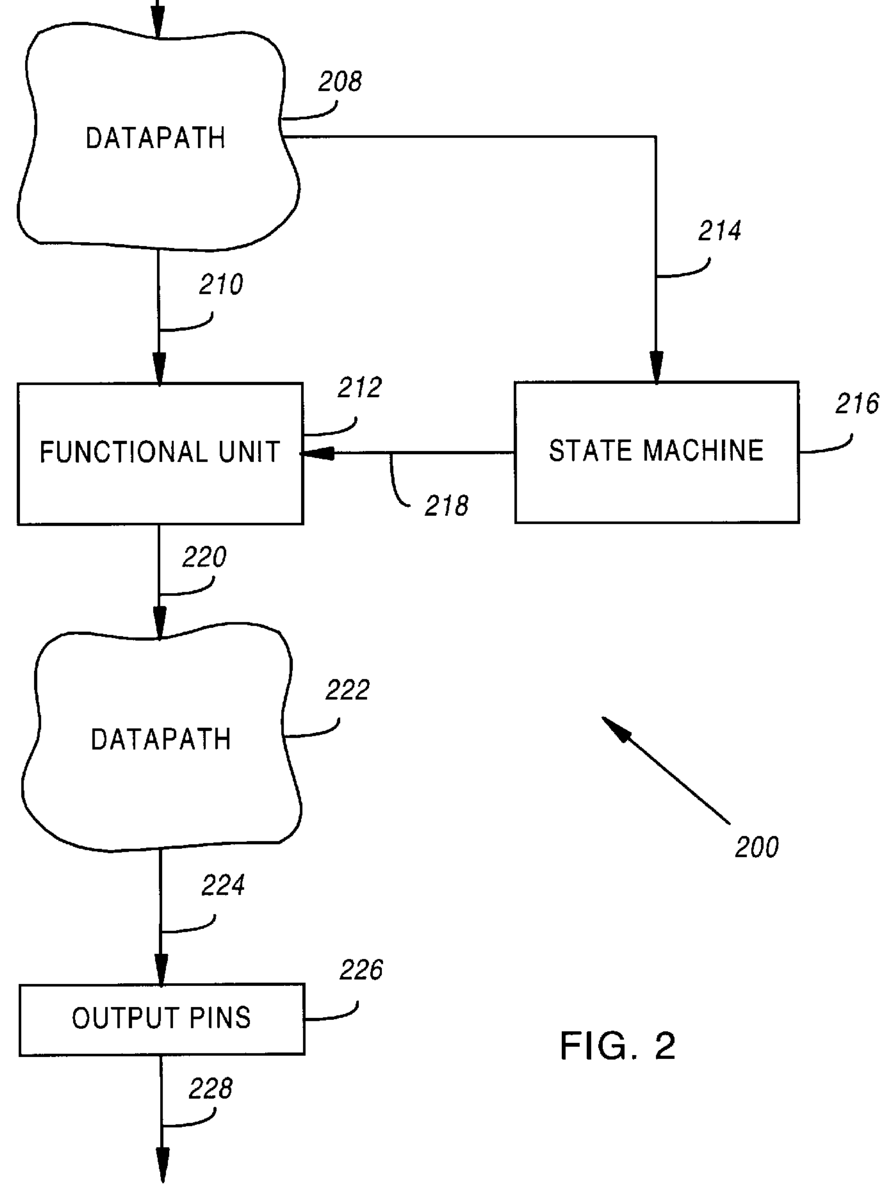
FIG. 2 is a schematic illustrating the interconnection of various components internal to the FIG. 1 integrated circuit.

FIG. 2 shows various internal components 200 of the FIG. 1 IC 100. The components 200 comprise datapath components 208, 222, a functional unit 212, and a state machine 216. The datapath components 208, 222 may comprise buses, registers, additional functional units, buffers, etc. Data 202 (comprising instructions and operands) is supplied to the various internal components 200 via integrated circuit input pins 204. The data 206 is then routed and/or processed through datapath components 208. Some or all of the instruction data 214 will eventually be input to the state machine 216, and some or all of the operand data 210 will eventually be input to the functional unit 212. In response to an instruction 214, the state machine 216 supplies the functional unit 212 with control data 218 which triggers the consumption of operands 210 input to the functional unit 212. The resultant data 220 produced by the functional unit 212 is then further routed and/or processed through datapath components 222, and if necessary, data 224, 228 is output from the IC 100 via its output pins 226. Note that the FIG. 2 input 204 and output 226 pins need not be distinct, and together may comprise a number of integrated circuit I/O pins 102. Similarly, the input and output datapath components 208, 222 may comprise shared structures.

As used in this description, the term "state machine" 216 is defined to include any device which supplies control data 218 to a functional unit. "Control data" is defined as any information which may be input into a functional unit 212.

In their preferred implementation, the methods and apparatus disclosed in this description are designed to provide appropriate opcode and rounding mode information (i.e., control data 218) to a floating-point unit (i.e., a functional unit or FPU 212) which is deeply embedded within a high performance IC 100 (e.g., a graphics chip or other ASIC). The FPU's control I/Os 218 are not accessible to the exterior of the chip 100.

Figure 3:
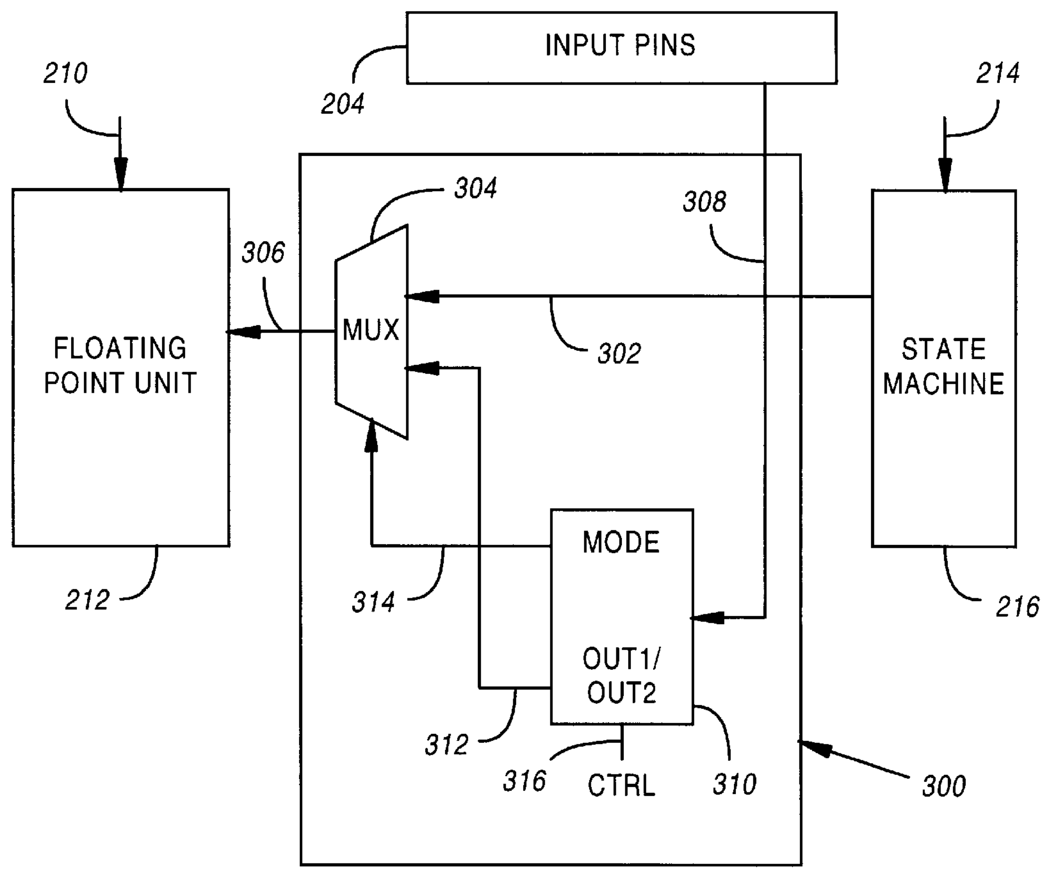
FIG. 3 is a schematic illustrating means for alternately providing the functional unit of FIGS. 1 and 2 with control data derived from a state machine, and control data derived from a number of integrated circuit input pins.

Elements which may be added to the IC 100 to allow for the electrical verification of its FPU 212 are illustrated in FIG. 3. The elements comprise a test control block 310 and a multiplexor 304. Rather than providing control data 218 directly to the FPU 212, the state machine 216 now provides control data 302 to an input of the multiplexor 304. During normal operation of the circuit contained within the IC 100, the multiplexor 304 is programmed to provide the FPU 212 with control data 302, 306 generated by the state machine 216. However, during electrical verification of the FPU 212, the multiplexor 304 is programmed to provide the FPU 212 with control data 312, 306 stored in the test control block 310.

The test control block 310 comprises a control input 316 (possibly a multi-line input). In its preferred embodiment, and via its control input 316, the test control block 310 monitors data carried on various of the integrated circuit input pins 204 (or buses connected thereto, or various circuit points connected thereto) for a designated instruction 308. In response to sensing the instruction 308, the test control block 310 programs the multiplexor 304, and receives 502 control data 308 (which will most likely be generated external to the IC 100).

In an alternate embodiment, the test control block 310 receives signals (via its control input 316) which are derived from a processing unit located internally to the IC 100 in which it is contained.

Figure 4:
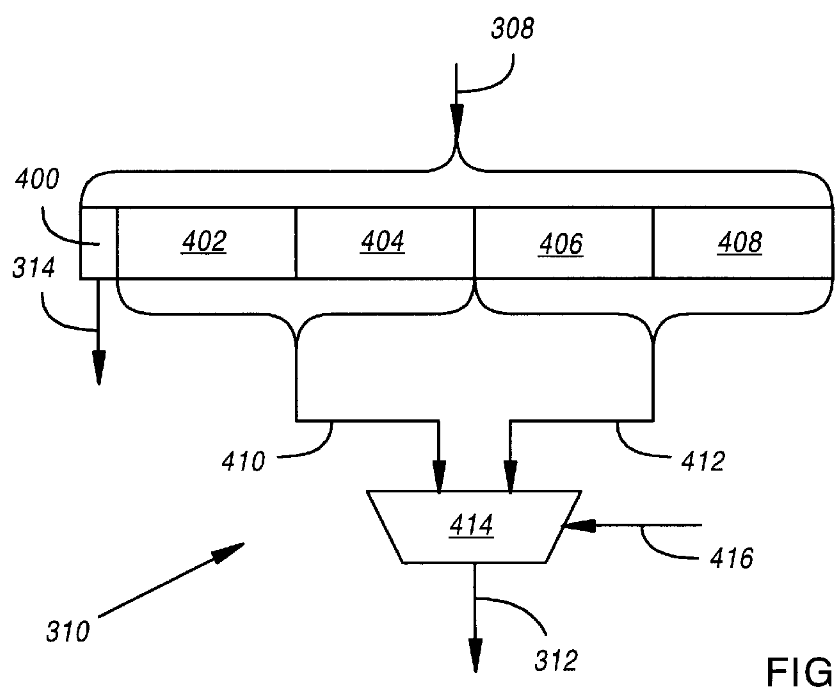
FIG. 4 is a schematic illustrating details of the FIG. 3 test control block.
Figure 5:
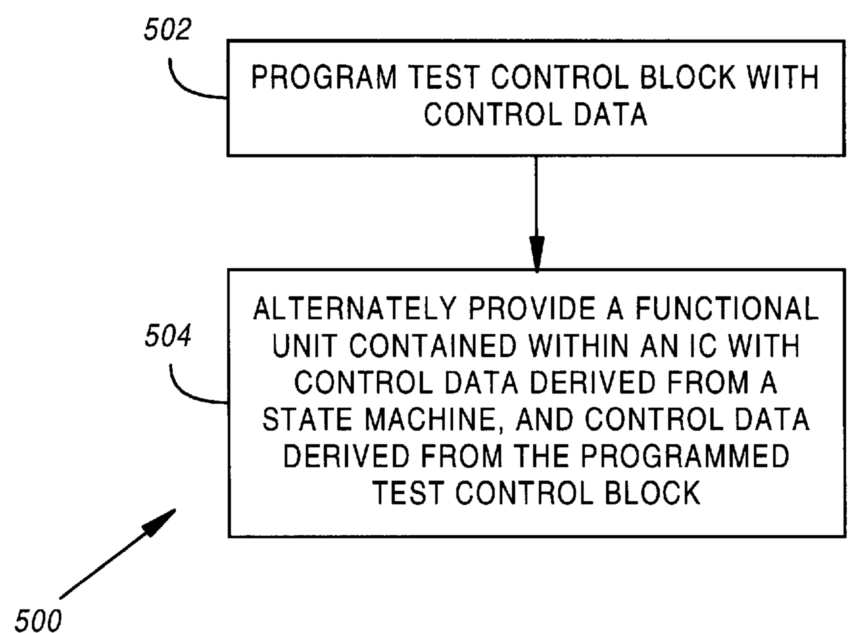
FIG. 5 is a flow chart illustrating a method of electrically verifying a functional unit contained within an integrated circuit.

Additional details of the test control block 310 are illustrated in FIG. 4. As shown in FIG. 4, the test control block 310 may comprise one or more test registers 400, 402, 404, 406, 408 and an additional multiplexor 414. In FIG. 4, the one or more test registers 400–408 consist of a single test register comprising control data storage space 402–408 and multiplexor control storage space 400. A single test mode bit 314 for programming the FIG. 3 multiplexor 304 is stored in the multiplexor control storage space 400 of the test register, and one or more states of control data are stored in the control data storage space 402–408. If two or more states of control data 410, 412 are stored in the control data storage space 402–408, the control data states 410, 412 may be multiplexed so that they are sequentially provided to a functional unit 212. Note that a multiplexor 414 used to toggle between two control data states 410, 412, 312 may be controlled by a simple high/low phase signal 416 such as a global or local clock.

When the test control block 310 is used for the electrical verification of a FPU 212, each control data state 410, 412 may comprise opcode 402, 406 and rounding mode 404, 408 data. Since most FPU I/Os are accessible externally to an IC 100 via parallel pin tests, the ability to override a state machine's control of a FPU 212, and provide specific opcode and rounding mode information to the FPU 212, allows an engineer to verify the FPU's electrical function under all combinations of opcode, rounding mode and operand inputs.

The above described apparatus is associated with very low overhead. From a hardware standpoint, fewer than fifty gates are required to implement the control instruction for the test control block, the test register 300–308, and the control data multiplexers 304, 414. Hardware overhead is therefore held at a minimum. From a software standpoint, test commands occur only once every several thousand test states, so test time overhead is also very low.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. Apparatus for providing control data to a functional unit contained within an integrated circuit, to assist in electrical verification of the functional unit, comprising:

a) a multiplexor comprising,
   i) a number of programmable select inputs;
   ii) a number of first data inputs;
   iii) a number of second data inputs; and
   iv) a number of outputs which are electrically coupled to said functional unit;
b) a state machine, electrically coupled to the number of first data inputs of the multiplexor; and
c) a number of circuit points, electrically coupled to the number of second data inputs of the multiplexor;
   wherein the functional unit is alternately provided with control data derived from the state machine, and control data derived from the number of circuit points, via the multiplexor, as determined by states of the number of programmable select inputs of the multiplexor.

2. Apparatus as in claim 1, wherein the number of circuit points comprises a number of integrated circuit input pins.

3. Apparatus as in claim 1, wherein the functional unit is a floating point unit.

4. Apparatus as in claim 3, wherein the control data comprises:

a) opcode data; and
b) rounding mode data.

5. Apparatus for providing control data to a functional unit contained within an integrated circuit, to assist in electrical verification of the functional unit, the integrated circuit being embedded in an integrated circuit package, the apparatus comprising:

a) a first multiplexor comprising,
   i) a number of programmable select inputs;
   ii) a number of first data inputs;
   iii) a number of second data inputs; and
   iv) a number of outputs which are electrically coupled to said functional unit;
b) a state machine, electrically coupled to the number of first data inputs of the first multiplexor; and
c) a number of integrated circuit input pins, electrically coupled to the number of second data inputs of the first multiplexor, and mounted on the integrated circuit package so as to be externally accessible on the integrated circuit package;
d) wherein the functional unit is alternately provided with control data derived from the state machine, and control data derived from the number of integrated circuit input pins, via the first multiplexor, as determined by states of the number of programmable select inputs of the first multiplexor.

6. Apparatus as in claim 5, further comprising a test control block, the number of integrated circuit input pins being electrically coupled to the number of second data inputs of the first multiplexor via the test control block, wherein;

the number of programmable select inputs of the first multiplexor are electrically coupled to a mode output of the test control block.

7. Apparatus as in claim 6, wherein the test control block comprises one or more test registers, and the one or more test registers comprise:

a) control data storage space which is electrically coupled to at least a first one of the number of integrated circuit input pins and the number of second data inputs of the first multiplexor; and
b) multiplexor control storage space which is electrically coupled to at least a second one of the number of integrated circuit input pins and the mode output of the test control block.

8. Apparatus as in claim 7, wherein:

a) the control data storage space comprises at least:
   i) first control data storage space; and
   ii) second control data storage space; and
b) the test control block further comprises a second multiplexor comprising:
   i) a number of first data inputs coupled to the first control data storage space;
   ii) a number of second data inputs coupled to the second control data storage space;
   iii) a number of programmable select inputs for receiving at least one phase signal; and
   iv) a number of outputs which are electrically coupled to the number of second data inputs of the first multiplexor;
   wherein the number of second data inputs of the first multiplexor is alternately provided with control data derived from the first control data storage space, and control data derived from the second control data storage space, via the second multiplexor, as determined by states of the number of programmable select inputs of the second multiplexor.

9. Apparatus as in claim 8, wherein the functional unit is a floating point unit, and the control data comprises:

a) opcode data; and
b) rounding mode data.

10. Apparatus as in claim 8, wherein the at least one phase signal is a clock signal.

11. Apparatus as in claim 6, wherein the test control block comprises a single test register, and the single test register comprises:

a) control data storage space which is electrically coupled to at least a first one of the number of integrated circuit input pins and the number of second data inputs of the first multiplexor; and
b) multiplexor control storage space which is electrically coupled to at least a second one of the number of integrated circuit input pins and the mode output of the test control block.

12. Apparatus as in claim 6, wherein the test control block comprises a control input which is electrically coupled to at least a first of the number of integrated circuit input pins.

13. Apparatus as in claim 6, wherein the test control block comprises a control input which is electrically coupled to a processing unit internal to the integrated circuit.

14. Apparatus as in claim 6, wherein the test control block comprises a control input which is electrically coupled to a number of circuit points embedded within the integrated circuit.

15. A method of providing control data to a functional unit contained within an integrated circuit, to assist in electrical verification of the functional unit, comprising:

a) programming a test control block with control data; and b) alternately providing the functional unit with control data derived from a state machine, and control data derived from the programmed test control block.

16. A method as in claim 15, further comprising:

a) monitoring a number of circuit points for a designated instruction; and b) in response to sensing the designated instruction on the number of circuit points, i) programming the test control block; and ii) providing the functional unit with control data derived from the programmed test control block.

17. A method as in claim 15, further comprising:

a) monitoring a number of integrated circuit input pins for a designated instruction;

b) in response to sensing the designated instruction on the number of integrated circuit input pins, i) programming the test control block; and ii) providing the functional unit with control data derived from the programmed test control block.

18. A method as in claim 15, wherein programming the test control block comprises:

a) loading a test register with first and second states of control data; and b) writing a test mode bit.

19. A method as in claim 18, wherein providing the functional unit with control data derived from the programmed test control block comprises the steps of:

a) providing the functional unit with the first state of control data; and then b) providing the functional unit with the second state of control data.

20. A method as in claim 15, further comprising providing the functional unit with operand data via a parallel pin test while providing the functional unit with control data derived from the programmed test control block.

* * * * *